US008947091B2

(12) United States Patent
Nakanishi et al.

(10) Patent No.: US 8,947,091 B2
(45) Date of Patent: Feb. 3, 2015

(54) MAGNETIC RESONANCE IMAGING APPARATUS AND METHOD WITH WIRELESS TRANSMISSION OF COMPRESSED ECHO SIGNALS THAT ARE EXPANDED AND EXTRACTED AT THE RECEIVER

(75) Inventors: Toshiyuki Nakanishi, Yokohama (JP); Koji Akita, Yokohama (JP); Takahiro Sekiguchi, Yokohama (JP); Kazuya Okamoto, Saitama (JP); Sojuro Kato, Nasushiobara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 1062 days.

(21) Appl. No.: 12/915,471

(22) Filed: Oct. 29, 2010

(65) Prior Publication Data
US 2011/0101977 A1 May 5, 2011

(30) Foreign Application Priority Data
Oct. 30, 2009 (JP) ................................ 2009-250917

(51) Int. Cl.
*G01R 33/36* (2006.01)
(52) U.S. Cl.
CPC ........ *G01R 33/3692* (2013.01); *G01R 33/3621* (2013.01)
USPC ............................ 324/322; 324/318; 324/307
(58) Field of Classification Search
USPC .......................... 324/300–322; 600/407–435; 382/128–131
See application file for complete search history.

(56) References Cited

U.S. PATENT DOCUMENTS

| 6,768,811 | B2 * | 7/2004 | Dinstein et al. | 382/128 |
| 7,433,810 | B2 * | 10/2008 | Pavloskaia et al. | 703/6 |
| 7,514,924 | B2 * | 4/2009 | Luedeke et al. | 324/309 |
| 7,970,203 | B2 * | 6/2011 | Avinash et al. | 382/154 |

(Continued)

FOREIGN PATENT DOCUMENTS

| JP | 5-261083 | 10/1993 |
| JP | 2010-115256 | 5/2010 |
| WO | 2009/147596 A1 | 12/2009 |

OTHER PUBLICATIONS

JP Office Action in JP 2009-250917 mailed Sep. 10, 2013 with English translation.

*Primary Examiner* — Melissa Koval
*Assistant Examiner* — Tiffany A. Fetzner
(74) *Attorney, Agent, or Firm* — Nixon & Vanderhye PC

(57) ABSTRACT

According to one embodiment, an MRI apparatus includes a probe unit and a control/imaging unit. The probe unit includes a probe, a converter, a compressor and a transmitter. The control/imaging unit includes a receiver, an expander and a reconstructor. The probe detects an RF echo signal generated in a subject by a magnetic resonance phenomenon. The converter digitizes the detected signal. The compressor compresses the digitized signal in accordance with a predetermined compression parameter to obtain a compressed signal. The transmitter generates a transmission signal to wirelessly transmit the compressed echo signal and sends the transmission signal to a radio channel. The receiver receives the transmission signal and extracts the compressed signal from the received signal. The expander expands the extracted compressed signal in accordance with the parameter to obtain the RF echo signal. The reconstructor generates a video signal regarding the subject on the basis of the obtained signal.

14 Claims, 9 Drawing Sheets

(56) References Cited

U.S. PATENT DOCUMENTS

| | | | |
|---|---|---|---|
| 8,244,192 B2* | 8/2012 | Prasidh et al. | 455/110 |
| 8,355,554 B2* | 1/2013 | Ma et al. | 382/131 |
| 8,502,540 B2* | 8/2013 | Nakanishi et al. | 324/322 |
| 8,548,560 B2* | 10/2013 | Saes et al. | 600/407 |
| 8,805,047 B2* | 8/2014 | Ma et al. | 382/131 |
| 8,811,697 B2* | 8/2014 | Sofka et al. | 382/128 |
| 2002/0090140 A1* | 7/2002 | Thirsk | 382/239 |
| 2003/0095694 A1* | 5/2003 | Dinstein et al. | 382/128 |
| 2003/0203717 A1* | 10/2003 | Chuprun et al. | 455/12.1 |
| 2008/0204027 A1* | 8/2008 | Luedeke et al. | 324/322 |
| 2008/0232718 A1* | 9/2008 | Avinash et al. | 382/305 |
| 2010/0117649 A1* | 5/2010 | Nakanishi et al. | 324/318 |
| 2010/0259261 A1* | 10/2010 | Saes et al. | 324/309 |
| 2010/0260398 A1* | 10/2010 | Ma et al. | 382/131 |
| 2011/0101977 A1* | 5/2011 | Nakanishi et al. | 324/307 |
| 2011/0103491 A1* | 5/2011 | Saes et al. | 375/241 |
| 2011/0124301 A1* | 5/2011 | Prasidh et al. | 455/110 |
| 2011/0243407 A1* | 10/2011 | Sofka et al. | 382/128 |
| 2013/0188832 A1* | 7/2013 | Ma et al. | 382/103 |
| 2014/0062480 A1* | 3/2014 | Bollenbeck et al. | 324/309 |

* cited by examiner

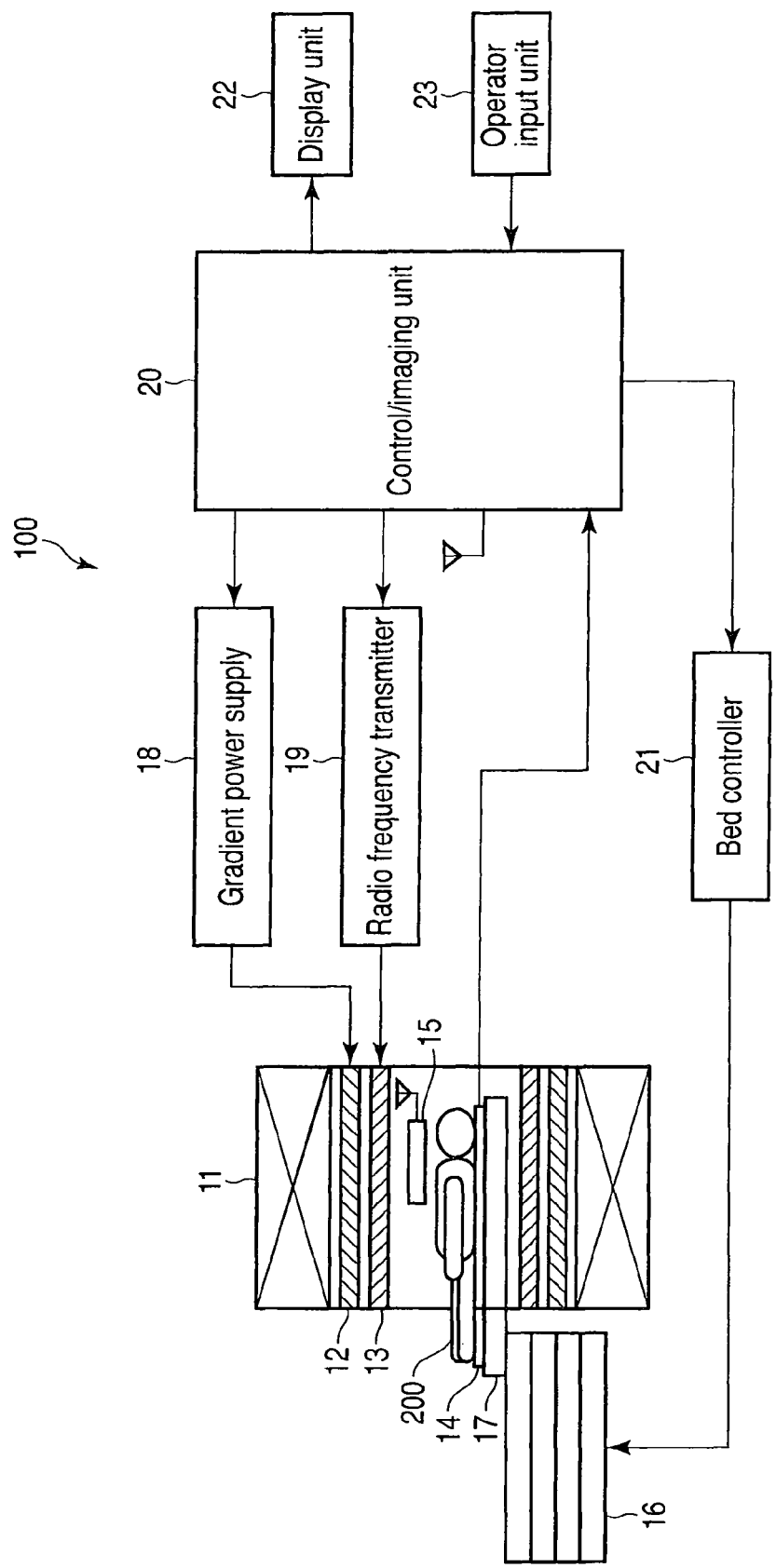
F I G. 1

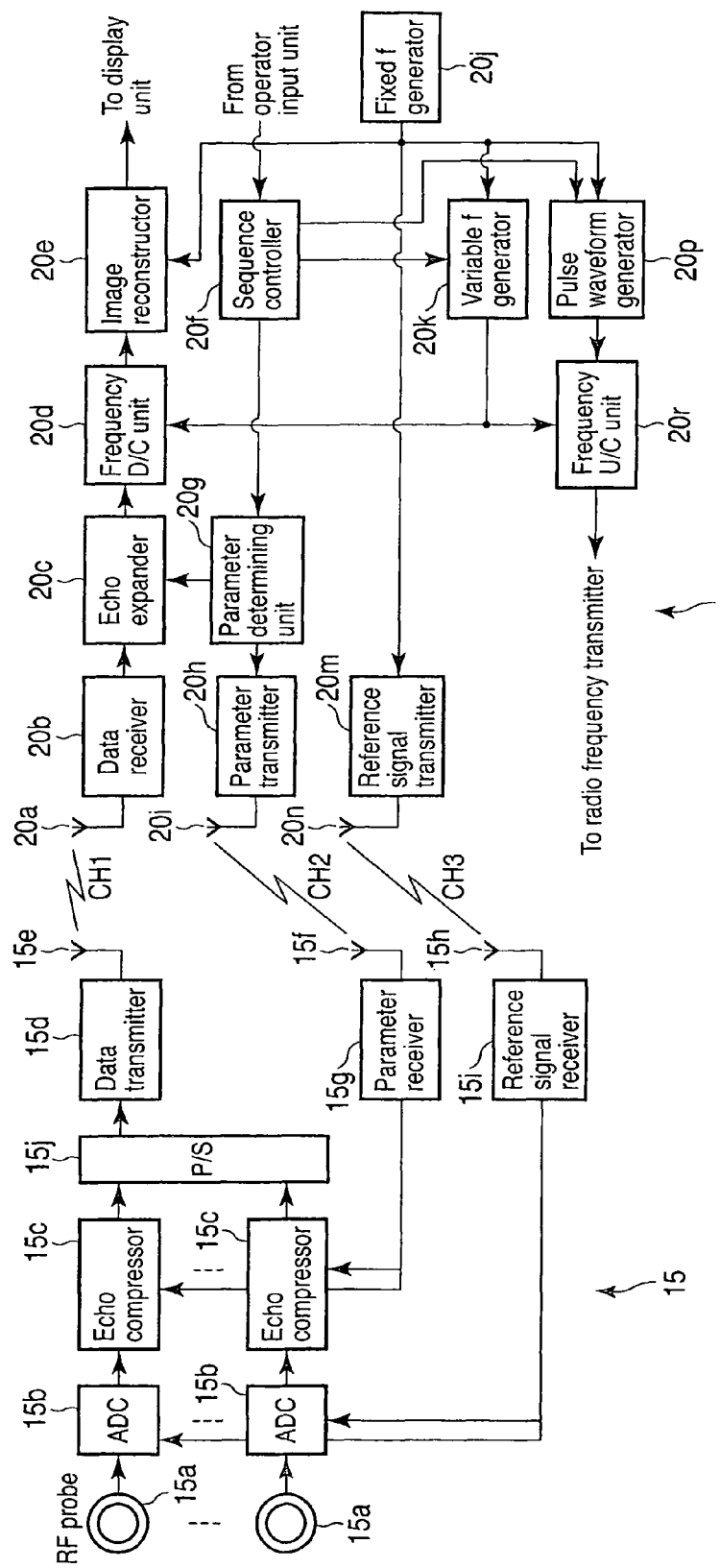
F I G. 3

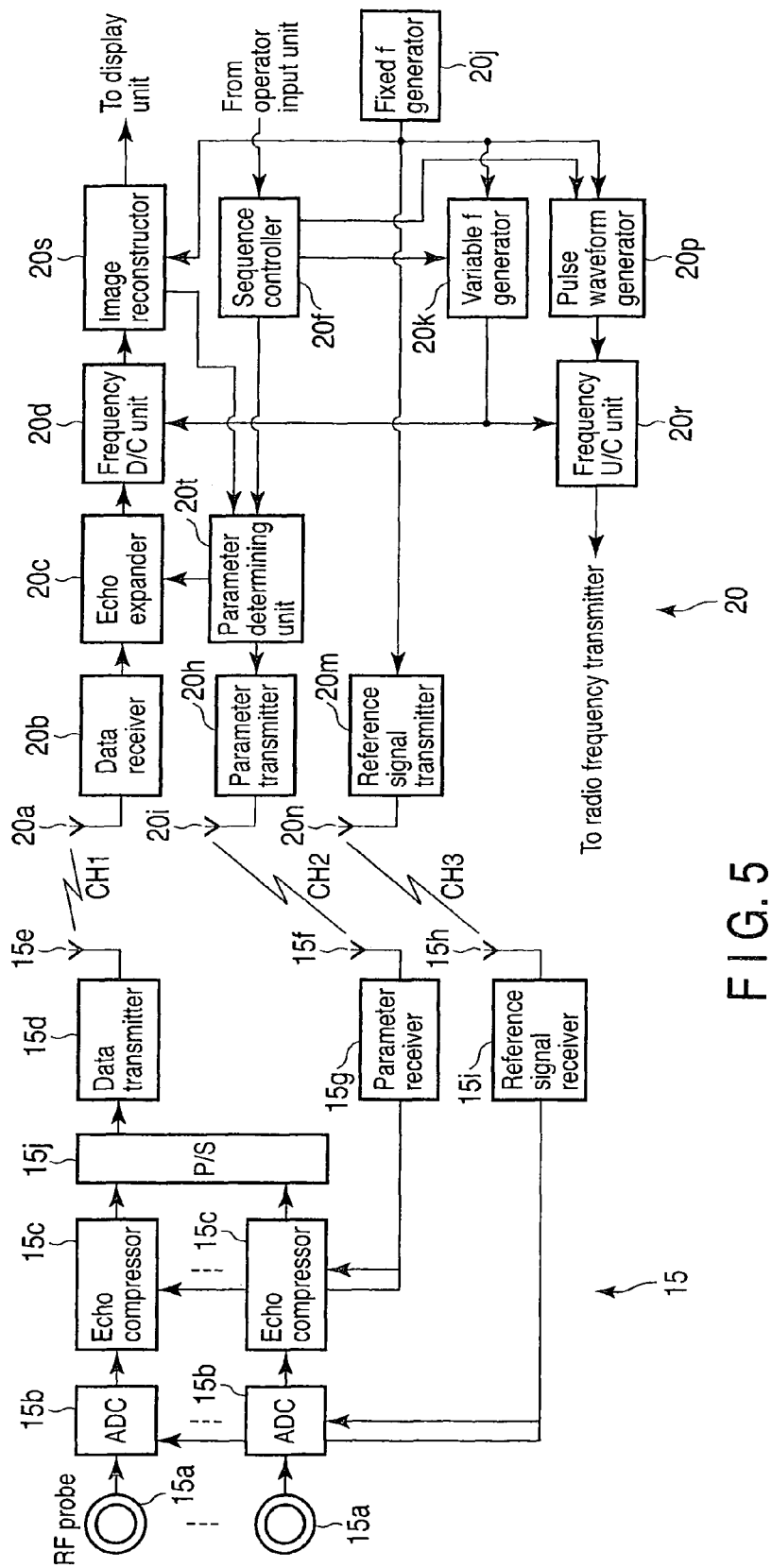
F I G. 5

MAGNETIC RESONANCE IMAGING APPARATUS AND METHOD WITH WIRELESS TRANSMISSION OF COMPRESSED ECHO SIGNALS THAT ARE EXPANDED AND EXTRACTED AT THE RECEIVER

CROSS-REFERENCE TO RELATED APPLICATIONS

This application is based upon and claims the benefit of priority from Japanese Patent Application No. 2009-250917, filed Oct. 30, 2009; the entire contents of which are incorporated herein by reference.

FIELD

Embodiments described herein relate generally to imaging that uses a magnetic resonance phenomenon.

BACKGROUND

In a magnetic resonance imaging apparatus (MRI apparatus), a detecting coil for receiving a magnetic resonance signal is located in an imaging space within a gantry together with a subject. The magnetic resonance signal detected by the detecting coil is generally transmitted from the imaging space to an main unit (hereinafter referred to as a control/imaging unit) via a cable extending to the outside of the gantry. The control/imaging unit subjects the magnetic resonance signal to data processing including image reconstruction processing and thereby images information regarding the subject.

In such a general configuration, the cable is often an obstacle. As disclosed in Jpn. Pat. Appln. KOKAI Publication No. 5-261083, it has been conceived that, in order to avoid such a disadvantage, the magnetic resonance signal is digitized by an analog-digital converter (ADC) in a probe unit that includes the detecting coil called an RF probe, and then converted into a radio signal and wirelessly transmitted to the control/imaging unit by a data transmitter.

A sampling rate for digitizing an RF signal has to be twice the frequency of an RF echo signal or more. Thus, if the RF echo signal is digitized as it is, a high transmission data rate is required for the data transmitter, and the power consumption of the whole probe unit is increased accordingly. As the probe unit that is designed for wireless use is activated by electric power supplied from a power source having a limited power capacity such as a secondary battery, the power consumption of the probe unit is desirably as low as possible.

It is therefore conceived to decrease the frequency of the RF echo signal by frequency down-conversion to decrease the sampling rate so that the transmission data rate required for the data transmitter may be decreased accordingly. When the frequency down-conversion is used, the frequency characteristic of a filter at the subsequent stage of a mixer is designed to be fixed, and the frequency of a local signal to be supplied to the mixer is desirably variable. However, it is not preferable to install, in the probe unit, sophisticated hardware that satisfies a high frequency resolution required for a frequency varying function of the MRI.

Under such circumstances, it has been requested to dispense with the frequency varying mechanism on the coil side, and at the same time to alleviate the data rate requirement of the data transmitter to reduce the load on the probe unit.

BRIEF DESCRIPTION OF THE DRAWINGS

FIG. 1 is a diagram showing a magnetic resonance imaging apparatus (MRI apparatus) according to first to fourth embodiments;

FIG. 3 is a block diagram of a modified configuration of part of the MRI apparatus according to the first embodiment;

FIG. 5 is a block diagram of a modified configuration of part of the MRI apparatus according to the second embodiment;

DETAILED DESCRIPTION

Figure 2:
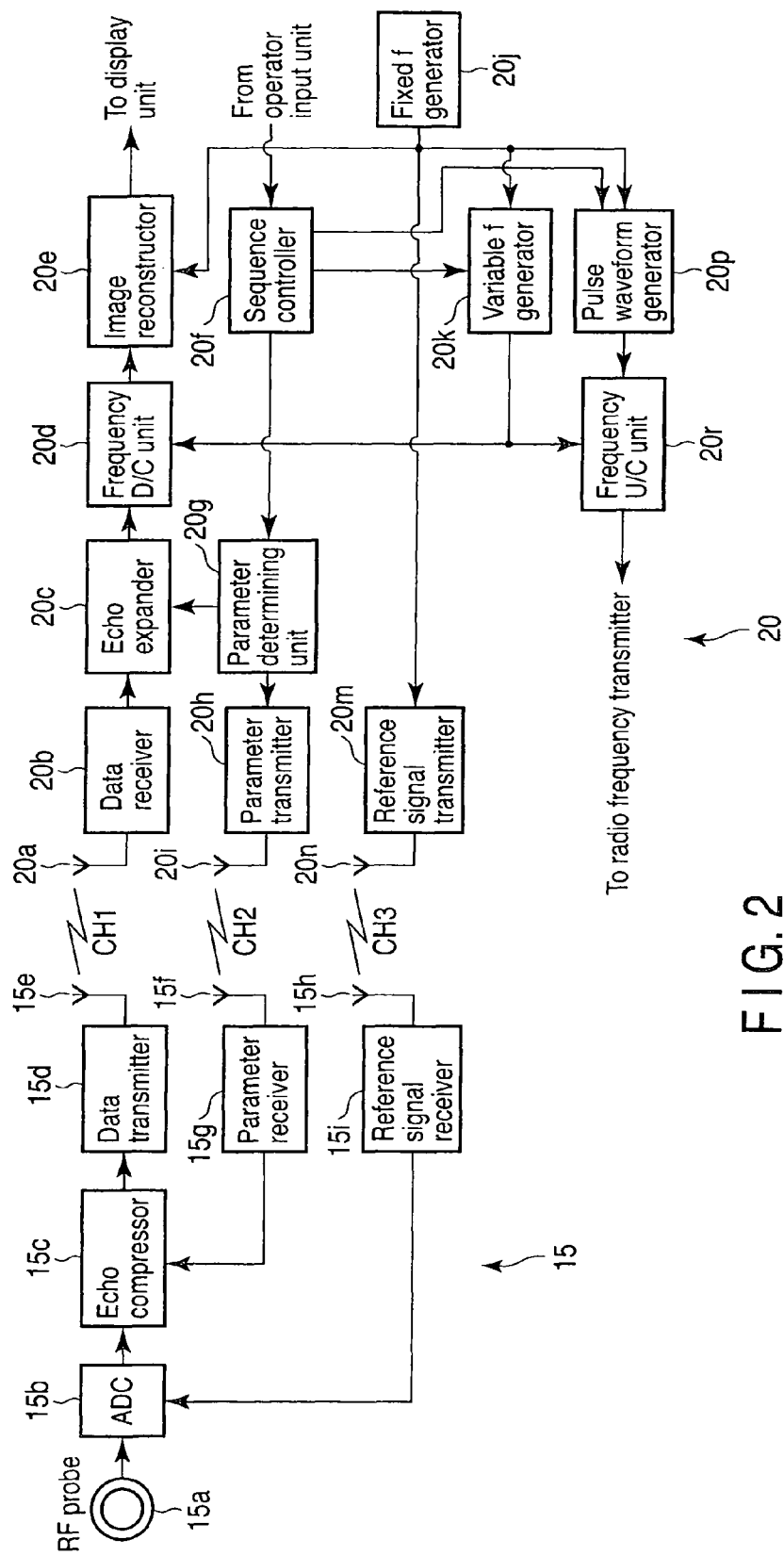
FIG. 2 is a block diagram of a detailed configuration of part of the MRI apparatus according to the first embodiment.

In general, according to one embodiment, a magnetic resonance imaging apparatus includes a probe unit and a control/imaging unit. The probe unit includes an RF probe, an analog-digital converter, an echo compressor and a first transmitter. The control/imaging unit includes a first receiver, an echo expander and an image reconstructor. The RF probe detects an RF echo signal generated in a subject by a magnetic resonance phenomenon. The analog-digital converter digitizes the RF echo signal detected by the RF probe. The echo compressor compresses the RF echo signal digitized by the analog-digital converter in accordance with a predetermined compression parameter to obtain a compressed echo signal. The first transmitter generates a first transmission signal to wirelessly transmit the compressed echo signal and sends the first transmission signal to a first radio channel. The first receiver receives the first transmission signal transmitted via the first radio channel and extracts the compressed echo signal from the received first transmission signal. The echo expander expands the compressed echo signal extracted by the first receiver in accordance with the compression parameter to obtain the RF echo signal. The image reconstructor generates a video signal regarding the subject on the basis of the RF echo signal obtained by the echo expander.

Hereinafter, embodiments will be described with reference to the drawings.

FIG. 1 shows a magnetic resonance imaging apparatus (MRI apparatus) 100 according to the first to fourth embodiments.

The MRI apparatus 100 comprises a static magnet 11, a gradient coil 12, an RF coil unit 13, a probe unit 14, a probe unit 15, a bed 16, a top board 17, a gradient power supply 18, a radio frequency transmitter 19, a control/imaging unit 20, a bed controller 21, a display unit 22 and an operator input unit 23.

The static magnet 11 has a hollow cylindrical shape, and generates a uniform static magnetic field in its internal space. For example, a permanent magnet or superconducting magnet is used as the static magnet 11. The gradient coil 12 has a hollow cylindrical shape, and is located inside the static magnet 11. The gradient coil 12 has a combination of three kinds of coils corresponding to X, Y, Z axes perpendicular to one another. The gradient coil 12 generates a gradient magnetic field having its intensity inclined along the X, Y, Z axes when the three kinds of coils are separately supplied with currents from the gradient power supply 18. Here, the Z axis is in the same direction as, for example, the direction of the static magnetic field.

The gradient magnetic fields of the X, Y, Z axes correspond to, for example, a slice selecting gradient magnetic field Gss, a phase encoding gradient magnetic field Gpe and a read-out gradient magnetic field Gro, respectively. The slice selecting gradient magnetic field Gss is used to determine a given imaging section. The phase encoding gradient magnetic field Gpe is used to change the phase of a magnetic resonance signal (RF echo signal) in accordance with a spatial position. The read-out gradient magnetic field Gro is used to change the frequency of the RF echo signal in accordance with the spatial position.

A subject 200 is inserted into an internal space (referred to as an imaging space) of the gradient coil 12 while being mounted on the top board 17. The bed 16 moves the top board 17 in its longitudinal direction (right-and-left direction in FIG. 1) and its vertical direction under the control of the bed controller 21. Normally, the bed 16 is installed so that the longitudinal direction of the top board 17 is parallel with the central axis of the static magnet 11.

The RF coil unit 13 includes one or more coils contained in a cylindrical case. The RF coil unit 13 is located inside the gradient coil 12. The RF coil unit 13 is supplied with a radio-frequency pulse (RF pulse) adapted to Larmor frequency from the radio frequency transmitter 19 to generate a high-frequency magnetic field. The probe unit 14 includes at least one RF probe which is an RF coil for detecting a magnetic resonance signal (RF echo) excited by the RF pulse. The probe unit 14 is located on the top board 17. The probe unit 14 may otherwise be incorporated in the top board 17. The probe unit 15 includes an RF probe which is an RF coil for detecting the RF echo. The probe unit 15 is attached to the subject 200.

The probe units 14, 15 are inserted into the imaging space together with the subject 200 during imaging, and detect the RF echo generated by a magnetic resonance phenomenon in the subject 200. Any types of probe units are attachable as the probe units 14, 15. The probe unit 14 has a function of sending the detected RF echo to the control/imaging unit 20 via a wired channel. The probe unit 15 is a unit independent of the main body of the MRI apparatus 100. The probe unit 15 has a function of sending the detected RF echo to the control/imaging unit 20 through a radio channel.

The control/imaging unit 20 controls the gradient power supply 18 and the radio frequency transmitter 19 to generate a gradient magnetic field and a high-frequency magnetic field in accordance with an imaging sequence. The control/imaging unit 20 receives the RF echoes which have been sent from the probe units 14, 15 and transmitted via the wired channel and the radio channel, respectively. The control/imaging unit 20 then subjects the received RF echoes to data processing including image reconstruction to generate a video signal of an image showing the form of the inside of the subject 200 and the spectrum of the magnetic resonance signal.

The display unit 22 displays the image on the basis of the video signal generated in the control/imaging unit 20.

An instruction given by an operator is input to the operator input unit 23. The operator input unit 23 provides the control/imaging unit 20 with a command that indicates the contents of the input instruction.

The general configuration of the MRI apparatus 100 is as described above. Several embodiments that differ in the more detailed configuration of the MRI apparatus 100 are described below.

(First Embodiment)

FIG. 2 is a block diagram of a detailed configuration of part of the MRI apparatus 100 according to the first embodiment. In FIG. 2, a characteristic configuration of the MRI apparatus 100 according to the first embodiment is shown. Components which are not essential in the first embodiment such as components associated with the control of the gradient power supply 18 and the radio frequency transmitter 19 are not shown.

The probe unit 15 according to the first embodiment includes an RF probe 15a, an analog-digital converter (ADC) 15b, an echo compressor 15c, a data transmitter 15d, a transmission antenna 15e, a reception antenna 15f, a parameter receiver 15g, a reception antenna 15h and a reference signal receiver 15i. The data transmitter 15d and the transmission antenna 15e configure a first transmitter. The reception antenna 15f and the parameter receiver 15g configure a second receiver. The reception antenna 15h and the reference signal receiver 15i configure a third receiver.

The RF probe 15a receives an RF echo signal. The ADC 15b samples and quantizes the RF echo signal in accordance with a sampling clock input from the reference signal receiver 15i, thereby digitizing the RF echo signal. In general, before input to the ADC 15b, the RF echo signal received by the RF probe 15a is amplified by a preamplifier such as a low noise amplifier (LNA) and filtered by a band pass filter (BPF). However, the preamplifier and the BPF are not shown in FIG. 2. A sampling rate in the ADC 15b is twice the maximum frequency of the RF echo signal or more. The RF echo signal digitized by the ADC 15b is input to the echo compressor 15c.

The echo compressor 15c compresses the RF echo signal input from the ADC 15b by use of a compression parameter input from the parameter receiver 15g. A known method for compressing a digital signal can be properly used for the compression of the RF echo signal. For example, the use of compressed sensing is assumed. In the case of the compressed sensing, the compression parameter is a sample decimating rate or sample decimating rule of the RF echo signals. In other words, a parameter related to the RF echo signal is used as the compression parameter. When the compression parameter is the sample decimating rate, the echo compressor 15c generates a sample decimating rule for random extraction from an input sample vector with a probability (1−sample decimating rate). Accordingly, the echo compressor 15c inputs the sample vector obtained by decimating samples out of the RF echo signal, to the data transmitter 15d as a compressed echo signal. Alternatively, the echo compressor 15c generates (number of input samples)×(1−sample decimating rate) random number vectors having the same number of elements as the input sample vector. The echo compressor 15c then inputs a sample vector obtained by calculating an inner product of each random number vector and the input sample, to the data transmitter 15d as a compressed echo signal. When the compression parameter is the sample decimating rule, the echo compressor 15c inputs a sample vector obtained by decimating samples out of the input sample vector in accordance with the sample decimating rule, to the data transmitter 15d as a compressed echo signal.

The data transmitter 15d uses the compressed echo signal input from the echo compressor 15c to perform error correcting encoding/interleaving, modulation, frequency conversion, amplification and filtering, thereby generating a first transmission signal. This first transmission signal is supplied to the transmission antenna 15e and thereby sent to the control/imaging unit 20 via a first radio channel CH1.

A second transmission signal sent from the control/imaging unit 20 and transmitted via a second radio channel CH2 is received by the reception antenna 15f, and input to the parameter receiver 15g. The parameter receiver 15g subjects the second transmission signal to amplification, frequency conversion, demodulation and de-interleaving/error correcting decoding. As a result of such processing, the parameter receiver 15g extracts a compression parameter from the second transmission signal. The compression parameter is input to the echo compressor 15c.

A third transmission signal sent from the control/imaging unit 20 and transmitted via a third radio channel CH3 is received by the reception antenna 15h, and input to the reference signal receiver 15i. The reference signal receiver 15i subjects the third transmission signal to amplification, frequency conversion and demodulation. As a result of such processing, the reference signal receiver 15i extracts a reference clock from the third transmission signal. The reference clock is input to the ADC 15b as a sampling clock. The reference clock may otherwise be multiplied by a PLL before input to the ADC 15b.

In the meantime, as shown in FIG. 2, the control/imaging unit 20 according to the first embodiment includes a reception antenna 20a, a data receiver 20b, an echo expander 20c, a frequency down-conversion unit (frequency D/C unit) 20d, an image reconstructor 20e, a sequence controller 20f, a parameter determining unit 20g, a parameter transmitter 20h, a transmission antenna 20i, a fixed frequency generator (fixed f generator) 20j, a variable frequency generator (variable f generator) 20k, a reference signal transmitter 20m, a transmission antenna 20n, a pulse waveform generator 20p and a frequency up-conversion unit (frequency U/C unit) 20r. The reception antenna 20a and the data receiver 20b configure a first receiver. The parameter transmitter 20h and the transmission antenna 20i configure a second receiver. The reference signal transmitter 20m and the transmission antenna 20n configure a third receiver.

The fixed frequency generator 20j is a device for generating a reference clock signal which repeats amplitude changes at a given frequency. The fixed frequency generator 20j is configured by, for example, a quartz oscillator having a significantly high stability. The reference clock signal is input to the variable frequency generator 20k as an input clock signal. The reference clock signal is also input to the reference signal transmitter 20m in order to synchronize the clock of the probe unit 15 with that of the control/imaging unit 20. The reference clock signal is also input to parts that require clock synchronization in the control/imaging unit 20, such as the image reconstructor 20e and the pulse waveform generator 20p.

The variable frequency generator 20k is a device which is activated by the reference clock signal input from the fixed frequency generator 20j and which generates a clock signal (local signal) having a variable frequency corresponding to a center frequency set value input from the sequence controller 20f. The variable frequency generator 20k comprises a phase-locked loop (PLL), a direct digital synthesizer (DDS) and a mixer. The local signal generated by the variable frequency generator 20k and having the variable frequency is input to the frequency down-conversion unit 20d and the frequency up-conversion unit 20r.

In the control/imaging unit 20, the first transmission signal transmitted from the probe unit 15 via the first radio channel CH1 is received by the reception antenna 20a, and input to the data receiver 20b. The data receiver 20b subjects the first transmission signal to amplification, frequency conversion, demodulation and de-interleaving/error correcting decoding. As a result of such processing, the data receiver 20b extracts a compressed echo signal from the first transmission signal. The extracted compressed echo signal is input to the echo expander 20c.

The echo expander 20c expands the compressed echo signal input from the data receiver 20b by use of the compression parameter input from the parameter determining unit 20g. As a result of such processing, the echo expander 20c reproduces the digital RF echo signal. The reproduced RF echo signal is input to the frequency down-conversion unit 20d. In the case of the compressed sensing, the compression parameter input from the parameter determining unit 20g includes a sample decimating rate or a sample decimating rule, an RF pulse center frequency and an RF pulse bandwidth. In other words, a parameter related to the RF echo signal is used as the compression parameter. The echo expander 20c first inserts a zero value into a thinned sample in accordance with the same random decimating rule as that used for the sample decimating in the echo compressor 15c, thereby restoring a sample vector having the same rate as the RF echo signal. Further, amplitude/phase estimation is repeated using frequency components in a frequency domain defined by the center frequency and the bandwidth, thereby restoring sample vector indicating the spectrum of the RF echo signal, that is, a digital RF echo signal. The RF echo signal thus obtained is input to the frequency down-conversion unit 20d. Alternatively, the echo expander 20c restores the RF echo signal by the following principle. The sample vector output by the ADC 15b of the probe unit 15 is represented by x=(x1, x2, ..., xL) using an echo line number L (natural number). However, xl= (1<=l<=L, an integral number) is xl={(x1,l), (x2,l), ..., (xN,l)}T when the number of samples per echo line is N. Thus, x is an N×L matrix.

A sample vector y after the decimating of samples in the echo compressor 15c is represented by y=Φx using a sample decimating matrix Φ. Φ is a matrix of M×N in which there only remain rows corresponding to M samples left after decimating based on the sample decimating rule out of a unit matrix of N×N. Alternatively, Φ is a random number matrix of M×N. The RF echo signal is normally a signal having a band that is significantly narrow for a sampling frequency. Thus, the RF echo signal can be converted into a sparse signal θ by fast Fourier transform (FFT) processing. θ=Fx when a matrix expression corresponding to the FFT processing is represented by F. In consequence, the sample vector y after the sample decimating is represented by y=Φx=ΦF⁻θ. θ can be estimated by solving the following optimization problem:

$$\arg\min \|\theta\|_{l_0} \quad \text{subject to} \quad y = \Phi x = \Phi F^- \theta$$

or $$\arg\min \|\theta\|_{l_1} \quad \text{subject to} \quad y = \Phi x = \Phi F^- \theta$$

wherein, $\|\bullet\|_{l_0}$ represents L0-norm, and $\|\bullet\|_{l_1}$ represents L1-norm.

Here, the mathematical expressions in the case where the same sample decimating rule is applied to all echo lines are shown. Otherwise, a different sample decimating rule can be applied to each echo line. In this case, a sample vector x is treated as x (x1; x2; ... ; xL) (a column vector having a length NL) in which x1s (1<=l<=L, an integral number) are longitudinally joined together. Moreover, Φ is a matrix in which Φ1s are lined on a principal diagonal and other elements are zero. Φ1 is a matrix of M1×N in which there only remain rows corresponding to M1 samples left after decimating out of the unit matrix of N×N. Alternatively, Φ1 is a random number matrix of M1×N.

The echo expander 20c finds a matrix x on the basis of the matrix θ estimated as described above, and uses this matrix as the RF echo signal.

The frequency down-conversion unit 20d multiplies the local signal input from the variable frequency generator 20k by the RF echo signal input from the echo expander 20c, and only passes a desired signal band through filtering, thereby achieving the frequency down-conversion of the RF echo signal. Magnetic resonance signal data thus obtained is input to the image reconstructor 20e.

The image reconstructor 20e subjects the magnetic resonance signal data to image reconstruction processing such as Fourier transform, and obtains image data (magnetic resonance image data) for a desired nuclear spin in the subject 200. Alternatively, the image reconstructor 20e obtains spectrum data for a desired nuclear spin, and thus obtains image data indicating the desired nuclear spin. The image data thus obtained by the image reconstruction is output to the display unit 22.

The pulse waveform generator 20p generates a base band pulse waveform by use of a reference clock signal input from the fixed frequency generator 20j. This base band pulse waveform is input to the frequency up-conversion unit 20r.

The frequency up-conversion unit 20r multiplies the base band pulse waveform input from the pulse waveform generator 20p by the local signal input from the variable frequency generator 20k, and only passes a desired signal band through filtering, thereby achieving the frequency up-conversion of the base band pulse waveform. A signal thus obtained is input to the radio frequency transmitter 19.

The sequence controller 20f determines the period of the RF pulse, the kind of RF pulse, the center frequency of the RF pulse and the bandwidth of the RF pulse in the imaging sequence, in accordance with imaging conditions (e.g., a part to be imaged, the kind of probe used, and a selected slice width) input by the operator by use of the operator input unit 23. The center frequency of the RF pulse is reported to the variable frequency generator 20k. The period of the RF pulse, the kind of RF pulse and the bandwidth of the RF pulse are reported to the pulse waveform generator 20p. Moreover, the part to be imaged, the kind of probe used, the center frequency of the RF pulse and the bandwidth of the RF pulse are reported to the parameter determining unit 20g. The center frequency is directly input by the operator in accordance with the static magnetic field that varies, for example, with time, or stored and continuously used. The center frequency may be further adjusted by the sequence controller 20f in accordance with the slice selected by the operator.

The parameter determining unit 20g has, in association with a part to be imaged and imaging conditions that are assumed, a table describing a compression parameter suited to the part to be imaged and the imaging conditions. In the case of the compressed sensing, tests are previously conducted for a great number of imaging conditions different in the part to be imaged, the kind of probe used, the center frequency of the RF pulse and the bandwidth of the RF pulse that are input from the sequence controller 20f. A sample decimating rate or sample decimating rule suited to each of the great number of imaging conditions is determined to create the above-mentioned table. The parameter determining unit 20g selects a most suitable sample decimating rate or sample decimating rule in accordance with the part to be imaged, the kind of probe used, the center frequency of the RF pulse and the bandwidth of the RF pulse that are input from the sequence controller 20f. The parameter determining unit 20g then inputs the sample decimating rate or sample decimating rule to the echo expander 20c as a compression parameter together with the bandwidth of the RF pulse and the center frequency of the RF pulse. The parameter determining unit 20g also inputs the sample decimating rate or sample decimating rule to the parameter transmitter 20h as a compression parameter.

The parameter transmitter 20h subjects the compression parameter input from the parameter determining unit 20g to proper error correcting encoding/interleaving, modulation, frequency conversion, amplification and filtering to generate a second transmission signal. This second transmission signal is supplied to the transmission antenna 20i, and thereby sent to the probe unit 15 via the second radio channel CH2.

The reference signal transmitter 20m subjects the reference clock signal input from the fixed frequency generator 20j to modulation, frequency conversion, amplification and filtering to generate a third transmission signal. This third transmission signal is supplied to the transmission antenna 20n, and thereby sent to the probe unit 15 via the third radio channel CH3.

Thus, according to the MRI apparatus 100 in the first embodiment, the ADC 15b digitizes the RF echo signal at a sampling rate twice the maximum frequency of the RF echo signal or more. From a sample vector thus obtained, a compressed echo signal obtained by decimating some of the samples in the echo compressor 15c is sent by the data transmitter 15d. Therefore, even if the RF echo signal is not subjected to the frequency down-conversion, the data transmitter 15d has only to be adapted to a transmission data rate lower than the sampling rate which is twice the maximum frequency of the RF echo signal or more. As a result, the probe unit 15 does not have to be provided with any frequency down-conversion unit, and a data rate requirement of the data transmitter 15d can be alleviated, thus allowing the reduction of the load on the probe unit 15. In addition, the probe unit 15 needs the echo compressor 15c. However, the processing in the echo compressor 15c only includes decimating some of the samples of the compressed echo signal in accordance with the sample decimating rule. Therefore, the echo compressor 15c can have a simpler configuration than that of the frequency down-conversion unit.

Furthermore, according to the MRI apparatus 100 in the first embodiment, compression can be achieved by use of a compression parameter suited to the part to be imaged and the imaging condition, so that optimum compression can be performed for various imaging targets/imaging sequence.

The parameter determining unit 20g does not necessarily have to be included in the control/imaging unit 20. The parameter determining unit 20g may be included in the probe unit 15. In this case, the control/imaging unit 20 has only to be configured to report sequence information to the probe unit 15 so that the parameter determining unit 20g may select a parameter accordingly.

The probe unit 15 may otherwise be configured to have a plurality of RF probes 15a. In this case, as shown in FIG. 3, a plurality of ADCs 15b and a plurality of echo compressors 15c are provided to correspond to the respective RF probes 15a. Moreover, a parallel/serial converter (P/S) 15j is provided. Compressed echo signals output from the echo compressors 15c are independently input to the parallel/serial converter 15j, and the parallel/serial converter 15j rearranges these compressed echo signals into a serial form. The parallel/serial converter 15j sends one obtained compressed echo signal to the data transmitter 15d.

When the probe unit 15 has a plurality of RF probes 15a as shown in FIG. 3, the image reconstructor 20e generates projection data in the arrangement direction of the RF probes 15a on the basis of the magnetic resonance signal data on the magnetic resonance signal received by particular one of the plurality of RF probes 15a.

(Second Embodiment)

Figure 4:
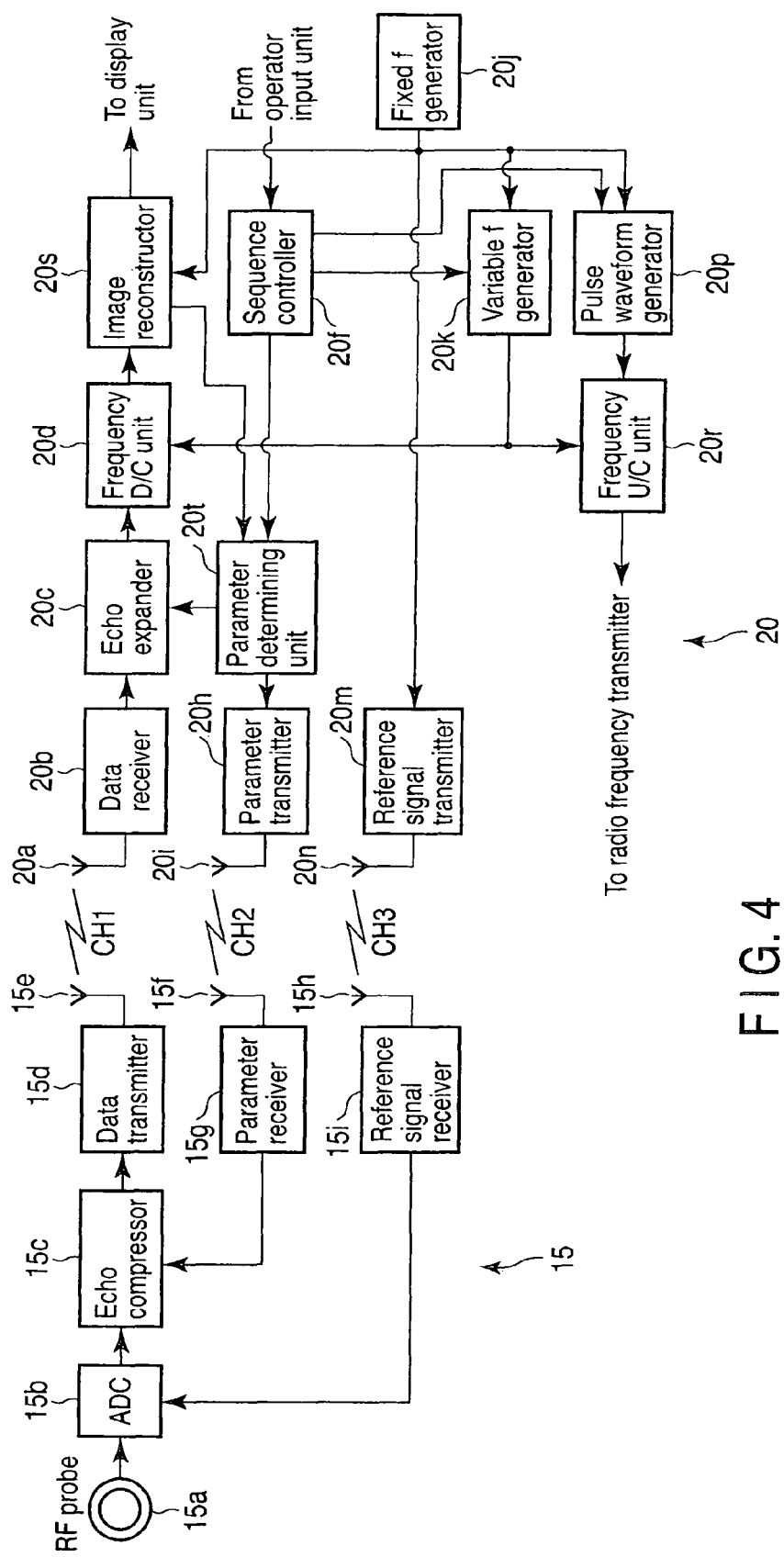
FIG. 4 is a block diagram of a detailed configuration of part of the MRI apparatus according to the second embodiment.

FIG. 4 is a block diagram of a detailed configuration of part of the MRI apparatus 100 according to the second embodiment. In FIG. 4, a characteristic configuration of the MRI apparatus 100 according to the second embodiment is shown. Components which are not essential in the second embodiment such as components associated with the control of the gradient power supply 18 and the radio frequency transmitter 19 are not shown. In FIG. 4, the same components as those in FIG. 2 are provided with the same reference numbers and are not described in detail.

The probe unit 15 according to the second embodiment includes an RF probe 15a, an analog-digital converter (ADC) 15b, an echo compressor 15c, a data transmitter 15d, a transmission antenna 15e, a reception antenna 15f, a parameter receiver 15g, a reception antenna 15h and a reference signal receiver 15i. That is, the probe unit 15 has the same configuration in the first embodiment and the second embodiment.

In the meantime, the control/imaging unit 20 according to the second embodiment includes a reception antenna 20a, a data receiver 20b, an echo expander 20c, a frequency down-conversion unit (frequency D/C unit) 20d, a sequence controller 20f, a parameter transmitter 20h, a transmission antenna 20i, a fixed frequency generator (fixed f generator) 20j, a variable frequency generator (variable f generator) 20k, a reference signal transmitter 20m, a transmission antenna 20n, a pulse waveform generator 20p, a frequency up-conversion unit (frequency U/C unit) 20r, an image reconstructor 20s and a parameter determining unit 20t. That is, the control/imaging unit 20 according to the second embodiment has the image reconstructor 20s and the parameter determining unit 20t instead of the image reconstructor 20e and the parameter determining unit 20g in the control/imaging unit 20 according to the first embodiment.

The image reconstructor 20s subjects magnetic resonance signal data input from the frequency down-conversion unit 20d to image reconstruction processing such as Fourier transform, and obtains image data (magnetic resonance image data) for the magnetization of a desired nuclear species in the subject 200. Alternatively, the image reconstructor 20s obtains spectrum data for a desired nuclear spin, and thus obtains image data indicating the desired nuclear spin. The image data thus obtained by the image reconstruction is output to the display unit 22. The image reconstructor 20s also calculates a signal-to-noise ratio (SNR) in the reconstructed image data, and compares this SNR with a desired SNR in order to instruct the parameter determining unit 20t to adjust a compression parameter accordingly. In the case of the compressed sensing, the SNR may be improved by decreasing the sample decimating rate. Thus, the image reconstructor 20s inputs, to the parameter determining unit 20t, a command to decrease the sample decimating rate when the SNR is lower than the desired SNR. On the other hand, the image reconstructor 20s inputs, to the parameter determining unit 20t, a command to increase the sample decimating rate when the SNR is higher than the desired SNR. The SNR is calculated and the increase or decrease of the sample decimating rate is ordered, for example, after the acquisition of one line echo in a calibration performed before a sequence, and before the acquisition of a first line echo in a sequence. Moreover, the SNR is calculated and the increase or decrease of the sample decimating rate is ordered after the acquisition of an n-th line echo in the sequence, and after the acquisition of an (n+1)-th line echo (note that n is 1 or more, and is a natural number less than the number of lines in the sequence). When image quality is improved by the synthesis of signals obtained by performing a plurality of sequences, a calculated value of the SNR in an image obtained in one sequence may be compared with the desired SNR set as a value of the SNR in a desired image to order the increase or decrease of the sample decimating rate used in a next sequence.

The parameter determining unit 20t has, in association with a part to be imaged and imaging conditions that are assumed, a table describing a compression parameter suited to the part to be imaged and the imaging conditions. In the case of the compressed sensing, tests are previously conducted for a great number of imaging conditions different in the part to be imaged, the kind of probe used, the center frequency of the RF pulse and the bandwidth of the RF pulse that are input from the sequence controller 20f. A sample decimating rate or sample decimating rule suited to each of the great number of imaging conditions is determined to create the above-mentioned table. The parameter determining unit 20t selects a most suitable sample decimating rate or sample decimating rule in accordance with the part to be imaged, the kind of probe used, the center frequency of the RF pulse and the bandwidth of the RF pulse that are input from the sequence controller 20f. The parameter determining unit 20t further updates the selected sample decimating rate or sample decimating rule to increase or decrease of the sample decimating rate in accordance with a command input from the image reconstructor 20s. The parameter determining unit 20t then inputs the updated sample decimating rate or sample decimating rule to the echo expander 20c as a compression parameter together with the bandwidth of the RF pulse and the center frequency of the RF pulse. The parameter determining unit 20t also inputs the sample decimating rate or sample decimating rule to the parameter transmitter 20h as a compression parameter.

Thus, according to the MRI apparatus 100 in the second embodiment, advantages provided by the MRI apparatus 100 in the first embodiment can be also brought about. Moreover, according to the MRI apparatus 100 in the second embodiment, the sample decimating rate can be adjusted to a minimum value at which the SNR in the reconstructed image is equal to the desired SNR.

Alternatively, the parameter determining unit 20t may only determine a sample decimating rate or sample decimating rule in accordance with a command input from the image reconstructor 20s without taking into account the part to be imaged and the imaging conditions.

The parameter determining unit 20t does not necessarily have to be included in the control/imaging unit 20. The parameter determining unit 20t may be included in the probe unit 15. In this case, the control/imaging unit 20 has only to be configured to report, to the probe unit 15, sequence information, and a command to increase or decrease the sample decimating rate or an SNR so that the parameter determining unit 20t may select a parameter accordingly.

The probe unit 15 may otherwise be configured to have a plurality of RF probes 15a. In this case, as shown in FIG. 5, a plurality of ADCs 15b and a plurality of echo compressors 15c are provided to correspond to the respective RF probes 15a. Moreover, a parallel/serial converter 15j is provided. Compressed echo signals output from the echo compressors 15c are independently input to the parallel/serial converter 15j, and the parallel/serial converter 15j rearranges these compressed echo signals into a serial form. The parallel/serial converter 15j sends one obtained compressed echo signal to the data transmitter 15d.

When the probe unit 15 has a plurality of RF probes 15a as shown in FIG. 5, the image reconstructor 20s generates projection data in the arrangement direction of the RF probes 15a on the basis of the magnetic resonance signal data on the magnetic resonance signal received by particular one of the plurality of RF probes 15a.

(Third Embodiment)

Figure 6:
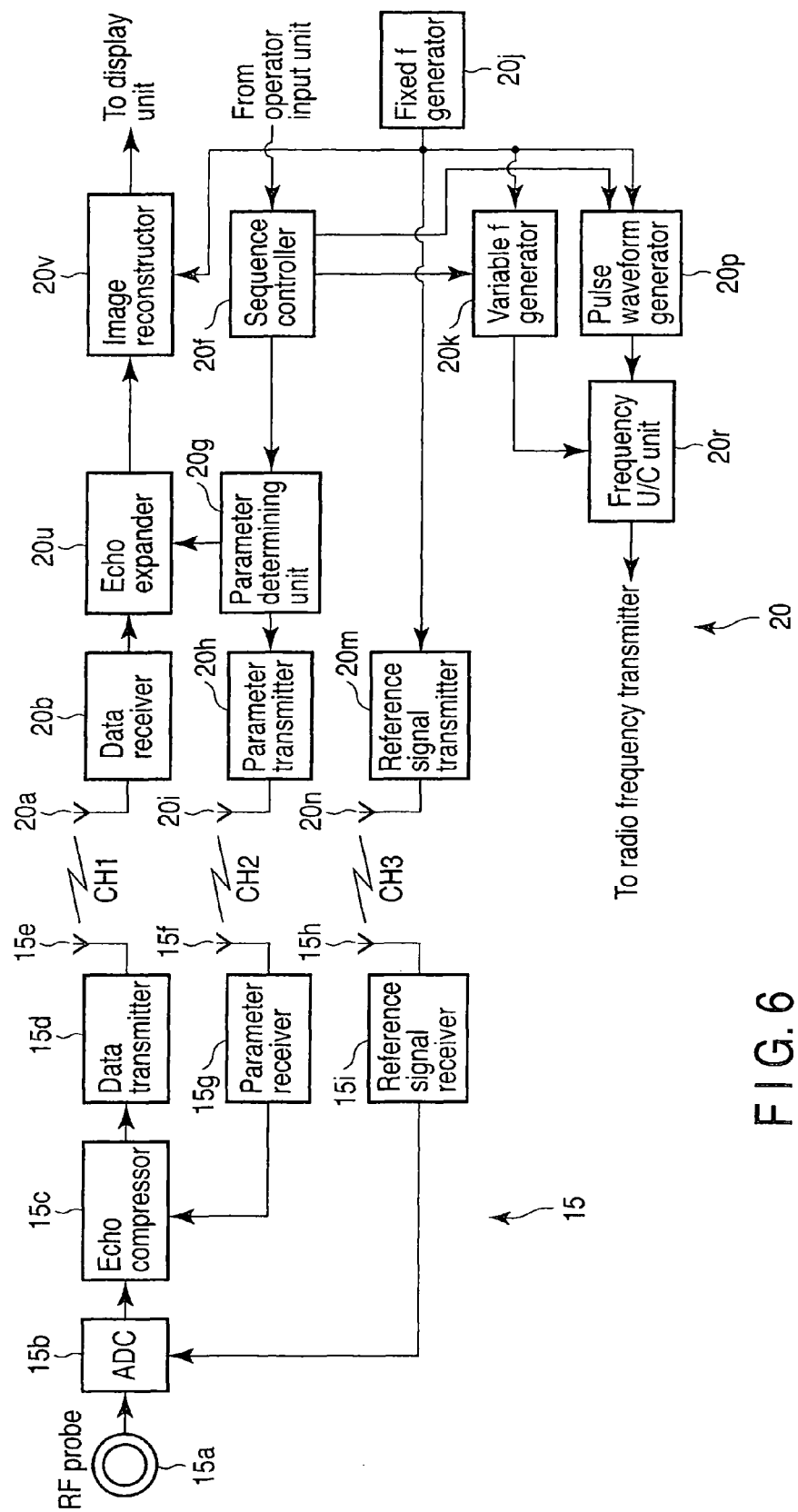
FIG. 6 is a block diagram of a detailed configuration of part of the MRI apparatus according to the third embodiment.

FIG. 6 is a block diagram of a detailed configuration of part of the MRI apparatus 100 according to the third embodiment. In FIG. 6, a characteristic configuration of the MRI apparatus 100 according to the third embodiment is shown. Components which are not essential in the third embodiment such as components associated with the control of the gradient power supply 18 and the radio frequency transmitter 19 are not shown. In FIG. 6, the same components as those in FIG. 2 are provided with the same reference numbers and are not described in detail.

The probe unit 15 according to the third embodiment includes an RF probe 15a, an analog-digital converter (ADC) 15b, an echo compressor 15c, a data transmitter 15d, a transmission antenna 15e, a reception antenna 15f, a parameter receiver 15g, a reception antenna 15h and a reference signal receiver 15i. That is, the probe unit 15 has the same configuration in the first embodiment and the third embodiment.

In the meantime, the control/imaging unit 20 according to the third embodiment includes a reception antenna 20a, a data receiver 20b, a sequence controller 20f, a parameter determining unit 20g, a parameter transmitter 20h, a transmission antenna 20i, a fixed frequency generator 20j, a variable frequency generator 20k, a reference signal transmitter 20m, a transmission antenna 20n, a pulse waveform generator 20p, a frequency up-conversion unit (frequency U/C unit) 20r, an echo expander 20u and an image reconstructor 20v. That is, the control/imaging unit 20 according to the third embodiment does not have the frequency down-conversion unit 20d in the first embodiment, and has the echo expander 20u and the image reconstructor 20v instead of the echo expander 20c and the image reconstructor 20e.

The echo expander 20u expands data input from the data receiver 20b by use of a parameter input from the parameter determining unit 20g to obtain an RF echo signal. The echo expander 20u inputs this RF echo signal to the image reconstructor 20v. In the case of the compressed sensing, the data input to the echo expander 20u from the data receiver 20b is a thinned sample vector, and the parameter input from the parameter determining unit 20g is a sample decimating rate or sample decimating rule. When the sample decimating rate is provided, the same random decimating rule as that used for the sample decimating in the echo compressor 15c is generated. The echo expander 20c estimates an image signal by the following principle in accordance with the sample decimating rule, and inputs the estimated image signal to the image reconstructor 20v.

The sample vector output by the ADC 15b of the probe unit 15 is represented by x=(x1, x2, ..., xL) using an echo line number L (natural number). However, xl=(1<=l<=L, an integral number) is xl={(x1,l), (x2,l), ..., (xN,l)}T when the number of samples per echo line is N. Thus, x is an N×L matrix.

A sample vector y after the decimating of samples in the echo compressor 15c is represented by y=Φx using a sample decimating matrix Φ. Φ is a matrix of M×N in which there only remain rows corresponding to M samples left after decimating based on the sample decimating rule out of a unit matrix of N×N. Alternatively, Φ is a random number matrix of M×N.

In conventional processing that images the sample vector x output by the ADC 15b, linear processing such as frequency conversion, filtering, decimation and FFT processing is performed to obtain a matrix expression m of an image. However, the size of the matrix m is P×P wherein P is the number of pixels in one side of the image. m=Fx when a matrix expression corresponding to the above-mentioned linear processing is represented by F. θ=Ψm=ΨFx if a conversion matrix for performing a basis conversion of the image matrix into a sparse matrix θ is represented by Ψ.

Consequently, the sample vector y after the sample decimating is represented by y=Φx=Φ(ΨF)−θ. θ can be estimated by solving the following optimization problem:

$$\underset{\theta}{\arg\min}\|\theta\|_{l_0} \quad \text{subject to } y = \Phi x = \Phi(\Psi F)^{-}\theta$$

or $$\underset{\theta}{\arg\min}\|\theta\|_{l_1} \quad \text{subject to } y = \Phi x = \Phi(\Psi F)^{-}\theta$$

wherein $\|\bullet\|_{l_0}$ represents L0-norm, and $\|\bullet\|_{l_1}$ represents L1-norm.

Here, the mathematical expressions in the case where the same sample decimating rule is applied to all echo lines are shown. However, a different sample decimating rule can be applied to each echo line. In this case, a sample vector x is treated as x (x1; x2; ...; xL) (a column vector having a length NL) in which xls (1<=l<=L, an integral number) are longitudinally joined together. Moreover, Φ is a matrix in which Φ1s are lined on a principal diagonal and other elements are zero. Φ1 is a matrix of M1×N in which there only remain rows corresponding to M1 samples left after decimating out of the unit matrix of N×N. Alternatively, Φ1 is a random number matrix of M1×N.

When the compressed sensing is applied in an image domain, the matrix m can be obtained from the estimated matrix θ by use of a relation θ=Ψm. Thus, part of processing for conversion from an echo signal to an image signal which is part of the processing in the image reconstructor 20v is included.

The image reconstructor 20v finds the matrix m on the basis of the matrix θ estimated in the echo expander 20u, and finds image data as data that indicates this matrix.

Thus, according to the MRI apparatus 100 in the third embodiment, advantages provided by the MRI apparatus 100 in the first embodiment can be also brought about. Moreover, the third embodiment enables a smaller calculation amount because the size of the matrix to be estimated is generally smaller than that in the first embodiment.

Figure 7:
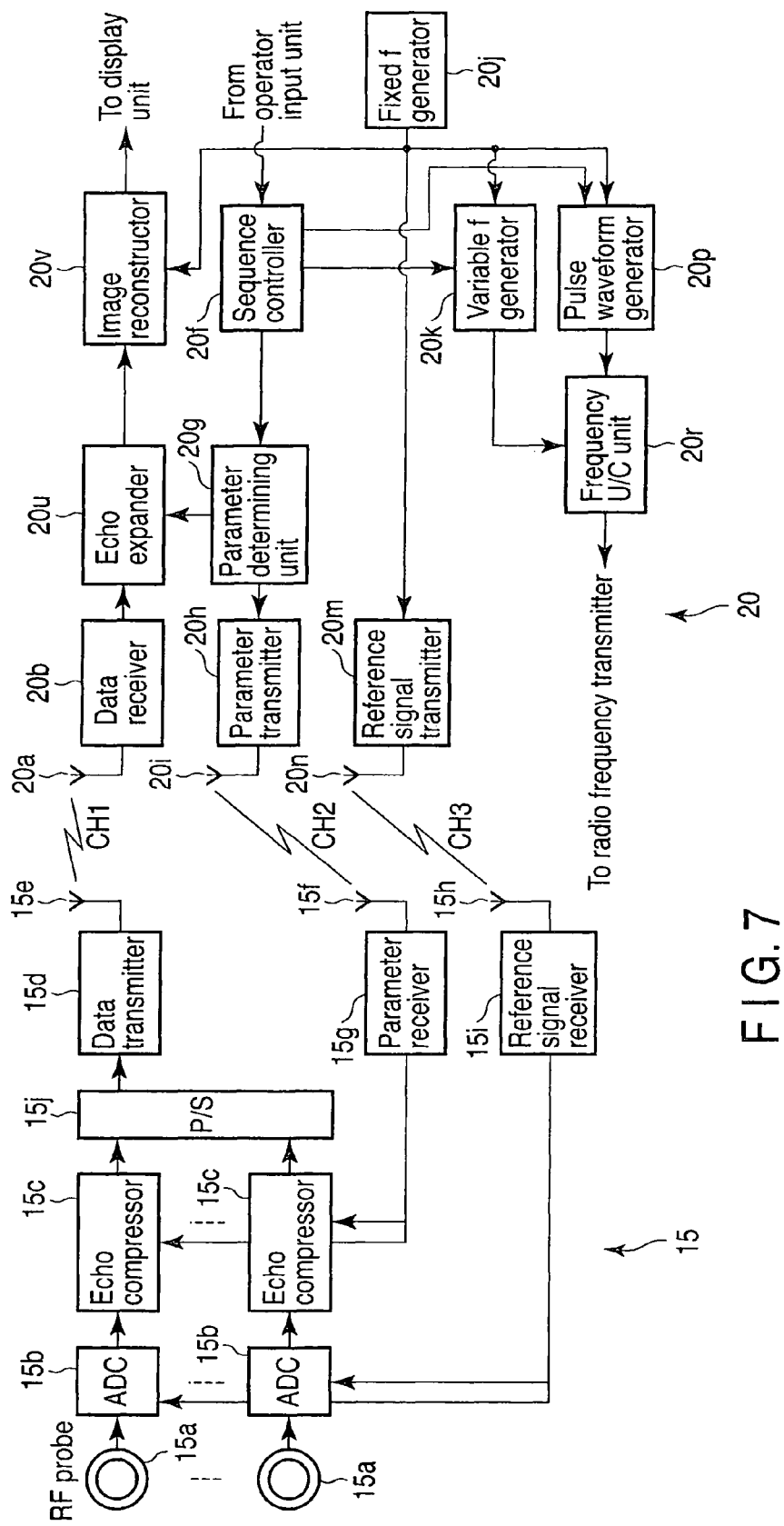
FIG. 7 is a block diagram of a modified configuration of part of the MRI apparatus according to the third embodiment.

The probe unit 15 may otherwise be configured to have a plurality of RF probes 15a. In this case, as shown in FIG. 7, a plurality of ADCs 15b and a plurality of echo compressors 15c are provided to correspond to the respective RF probes 15a. Moreover, a parallel/serial converter 15j is provided. Compressed echo signals output from the echo compressors 15c are independently input to the parallel/serial converter 15j, and the parallel/serial converter 15j rearranges these compressed echo signals into a serial form. The parallel/serial converter 15j sends one obtained compressed echo signal to the data transmitter 15d.

(Fourth Embodiment)

Figure 8:
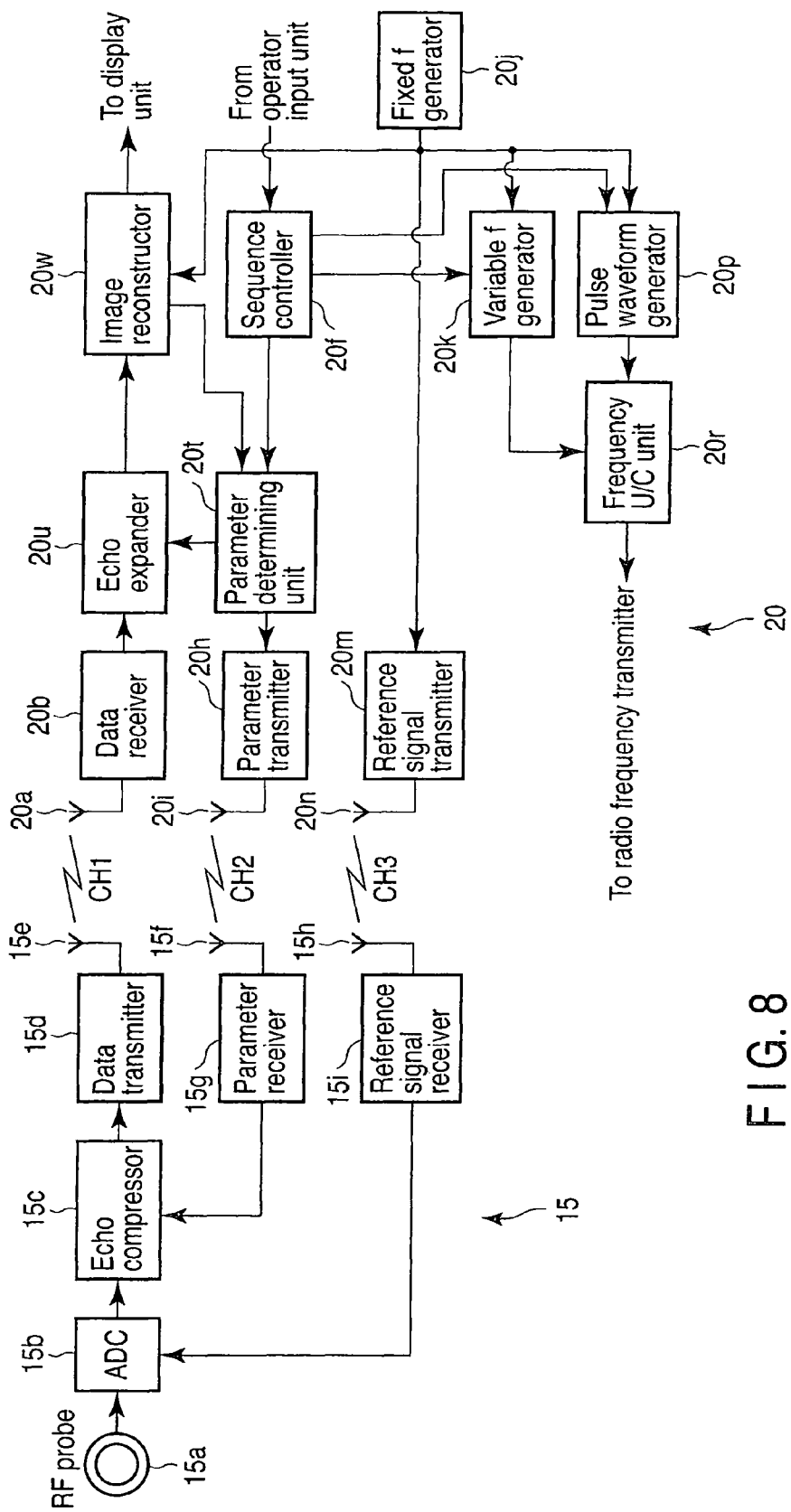
FIG. 8 is a block diagram of a detailed configuration of part of the MRI apparatus according to the fourth embodiment.

FIG. 8 is a block diagram of a detailed configuration of part of the MRI apparatus 100 according to the fourth embodiment. In FIG. 8, a characteristic configuration of the MRI apparatus 100 according to the fourth embodiment is shown. Components which are not essential in the fourth embodiment such as components associated with the control of the gradient power supply 18 and the radio frequency transmitter 19 are not shown. In FIG. 8, the same components as those in FIGS. 2, 4, 6 are provided with the same reference numbers and are not described in detail.

The probe unit 15 according to the fourth embodiment includes an RF probe 15a, an analog-digital converter (ADC) 15b, an echo compressor 15c, a data transmitter 15d, a transmission antenna 15e, a reception antenna 15f, a parameter receiver 15g, a reception antenna 15h and a reference signal receiver 15i. That is, the probe unit 15 has the same configuration in the first embodiment and the fourth embodiment.

In the meantime, the control/imaging unit 20 according to the fourth embodiment includes a reception antenna 20a, a data receiver 20b, a sequence controller 20f, a parameter transmitter 20h, a transmission antenna 20i, a fixed frequency generator 20j, a variable frequency generator 20k, a reference signal transmitter 20m, a transmission antenna 20n, a pulse waveform generator 20p, a frequency up-conversion unit (frequency U/C unit) 20r, a parameter determining unit 20t, an echo expander 20u and an image reconstructor 20w. That is, the control/imaging unit 20 according to the fourth embodiment does not have the frequency down-conversion unit 20d in the control/imaging unit 20 according to the first embodiment, and has the echo expander 20u, the image reconstructor 20w and the parameter determining unit 20t instead of the echo expander 20c, the image reconstructor 20e and the parameter determining unit 20g.

The echo expander 20u and the parameter determining unit 20t have the functions described in the third embodiment and the second embodiment.

The image reconstructor 20w has the function of obtaining image data similarly to the image reconstructor 20v according to the third embodiment, and the function of inputting a command to increase or decrease the sample decimating rate to the parameter determining unit 20t similarly to the image reconstructor 20s according to the second embodiment.

Thus, according to the MRI apparatus 100 in the fourth embodiment, advantages provided by the MRI apparatuses 100 in the first to third embodiments can be also brought about.

Figure 9:
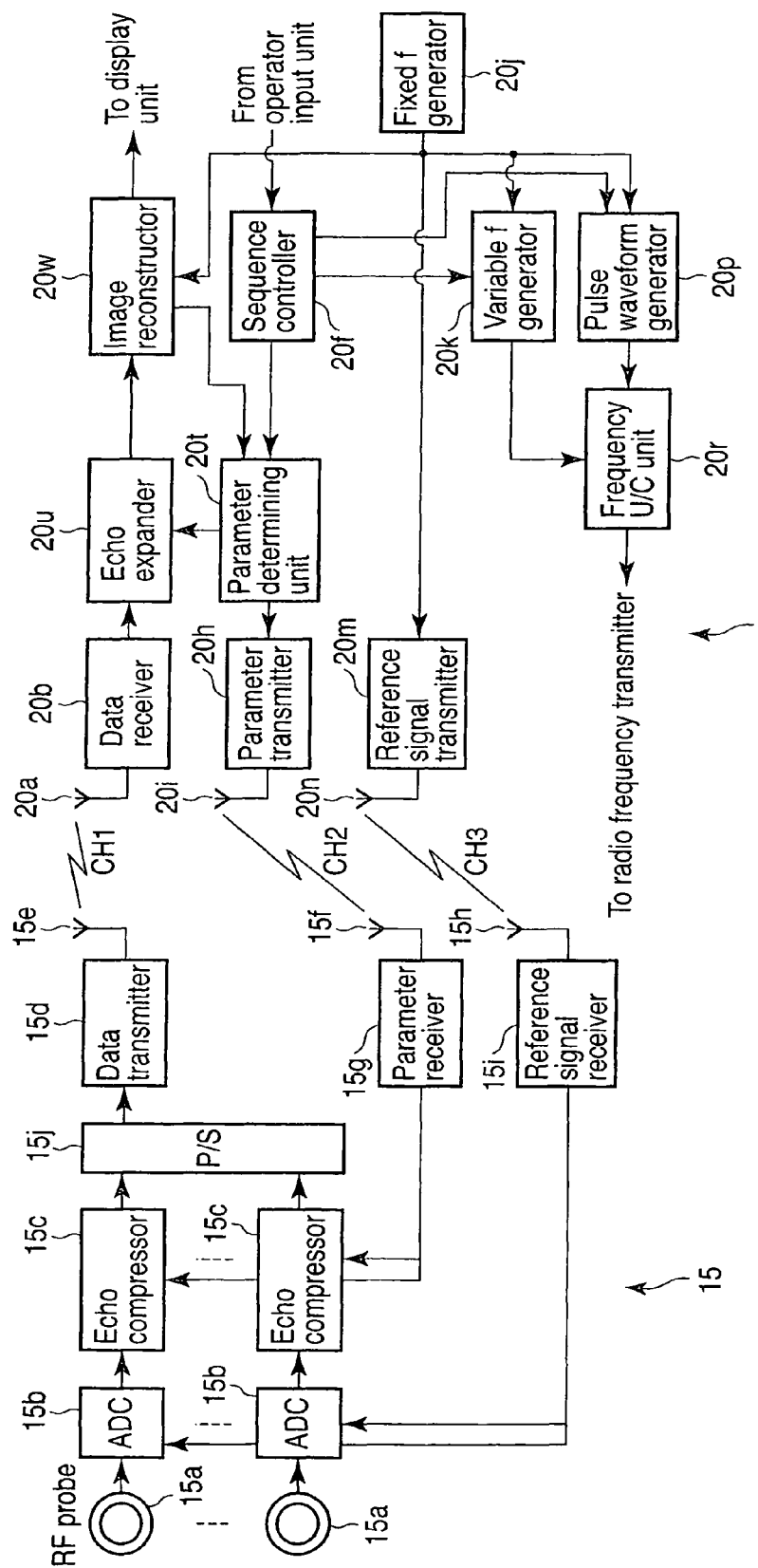
FIG. 9 is a block diagram of a modified configuration of part of the MRI apparatus according to the fourth embodiment.

The probe unit 15 may otherwise be configured to have a plurality of RF probes 15a. In this case, as shown in FIG. 9, a plurality of ADCs 15b and a plurality of echo compressors 15c are provided to correspond to the respective RF probes 15a. Moreover, a parallel/serial converter 15j is provided. Compressed echo signals output from the echo compressors 15c are independently input to the parallel/serial converter 15j, and the parallel/serial converter 15j rearranges these compressed echo signals into a serial form. The parallel/serial converter 15j sends one obtained compressed echo signal to the data transmitter 15d.

The reference clock signal and the compression parameter may be transmitted via one radio channel. That is, for example, a signal obtained by modulating the reference clock signal using a code vector that indicates the compression parameter is sent from the control/imaging unit 20 to the probe unit 15. For example, on-off-keying (OOK) or amplitude-shift-keying (ASK) can be used for this modulation. Thus, the probe unit 15 extracts the code vector that indicates the compression parameter from the above-mentioned signal sent from the control/imaging unit 20, and reproduces the reference clock signal.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising a probe unit and a control/imaging unit, the probe unit including:
an RF probe which detects an RF echo signal generated in a subject by a magnetic resonance phenomenon;
an analog-digital converter which digitizes the RF echo signal detected by the RF probe;
an echo compressor which acquires a compressed echo signal by decimating samples of the RF echo signal that was digitized by the analog-digital converter in accordance with a predetermined compression parameter; and
a first transmitter which generates a first transmission signal in order to wirelessly transmit the compressed echo signal and sends the first transmission signal to a first radio channel, the control/imaging unit including:
a first receiver which receives the first transmission signal transmitted via the first radio channel and extracts the compressed echo signal from the received first transmission signal;
an echo expander which expands the compressed echo signal extracted by the first receiver in accordance with the compression parameter in order to obtain the RF echo signal; and
an image reconstructor which generates a video signal regarding the subject on the basis of the RF echo signal obtained by the echo expander.

2. The magnetic resonance imaging apparatus according to claim 1, further comprising:
a parameter determining unit which determines the compression parameter,
wherein the echo compressor and the echo expander respectively perform both compression and expansion in accordance with the compression parameter determined by the parameter determining unit.

3. The magnetic resonance imaging apparatus according to claim 2, wherein
the image reconstructor generates the video signal in order to indicate an image showing the form of the subject, and calculates a signal-to-noise ratio (SNR) of the reconstructed and generated image, and
the parameter determining unit determines the compression parameter in accordance with the SNR calculated by the image reconstructor.

4. The magnetic resonance imaging apparatus according to claim 2, wherein the parameter determining unit determines the compression parameter on the basis of a part to be imaged and imaging conditions.

5. The magnetic resonance imaging apparatus according to claim 4, wherein
the image reconstructor generates the video signal in order to indicate an image showing the form of the subject, and calculates a signal-to-noise ratio (SNR) of the reconstructed and generated image, and the parameter determining unit determines the compression parameter in accordance with the SNR calculated by the image reconstructor.

6. The magnetic resonance imaging apparatus according to claim 2, wherein the parameter determining unit is included in the control/imaging unit, the control/imaging unit further includes a second transmitter which generates a second transmission signal in order to wirelessly transmit the compression parameter determined by the parameter determining unit and sends the second transmission signal to a second radio channel, and the probe unit further includes a second receiver which receives the second transmission signal transmitted via the second radio channel and judges the compression parameter from the received second transmission signal.

7. The magnetic resonance imaging apparatus according to claim 2, wherein the parameter determining unit is determining at least one of parameters regarding the RF echo signal as the compression parameter.

8. The magnetic resonance imaging apparatus according to claim 1, wherein the control/imaging unit further includes a frequency down-conversion unit which performs a frequency down-conversion of the RF echo signal obtained by the echo expander, the echo compressor acquires the compressed echo signal by decimating samples in accordance with a sample decimating rate, or sample decimating rule, indicated by the compression parameter out of the RF echo signal digitized by the analog-digital converter, the echo expander inserts the sample thinned by the echo compressor into the compressed echo signal extracted by the first receiver in accordance with the sample decimating rate, or sample decimating rule, indicated by the compression parameter, and then generates an estimation of amplitude and phase by use of frequency components in a frequency domain defined by a center frequency and a bandwidth of an RF pulse which is applied to the subject in order to cause the magnetic resonance phenomenon, thereby acquiring the RF echo signal, and the image reconstructor generates the video signal on the basis of the RF echo signal which has undergone the frequency down-conversion in the frequency down-conversion unit.

9. The magnetic resonance imaging apparatus according to claim 1, wherein the echo compressor acquires the compressed echo signal by decimating samples in accordance with a sample decimating rate, or sample decimating rule, indicated by the compression parameter out of the RF echo signal digitized by the analog-digital converter, and the echo expander estimates a pixel value of an image signal by reference to the sample decimating rate, or sample decimating rule, indicated by the compression parameter.

10. A method of imaging a subject by a magnetic resonance imaging apparatus which comprises a probe unit and a control/imaging unit, wherein in the probe unit, detecting an RF echo signal generated in the subject by a magnetic resonance phenomenon, digitizing the detected RF echo signal, acquiring a compressed echo signal by decimating samples of the digitized RF echo signal in accordance with a predetermined compression parameter, and generating a first transmission signal in order to wirelessly transmit the compressed echo signal and sends the first transmission signal to a first radio channel, and in the control/imaging unit:

receiving the first transmission signal transmitted via the first radio channel and extracts the compressed echo signal from the received first transmission signal, expanding the extracted compressed echo signal in accordance with the compression parameter in order to obtain the RF echo signal, and generating a video signal regarding the subject on the basis of the obtained RF echo signal.

11. A probe unit used in a magnetic resonance imaging apparatus together with a control/imaging unit, the probe unit comprising:

an RF probe which detects an RF echo signal generated in a subject by a magnetic resonance phenomenon;

an analog-digital converter which digitizes the RF echo signal detected by the RF probe;

an echo compressor which acquires a compressed echo signal by decimating samples of the RF echo signal that was digitized by the analog-digital converter in accordance with a predetermined compression parameter; and a first transmitter which generates a first transmission signal in order to wirelessly transmit the compressed echo signal and sends the first transmission signal to a first radio channel.

12. The magnetic resonance imaging apparatus according to claim 11, further comprising:

a parameter determining unit which determines at least one of parameters regarding the RF echo signal as the compression parameter, wherein the echo compressor performs compression in accordance with the compression parameter determined by the parameter determining unit.

13. A control/imaging unit used in an magnetic resonance imaging apparatus together with a probe unit having functions of digitizing an RF echo signal generated in a subject by a magnetic resonance phenomenon, acquiring a compressed echo signal by decimating samples of the digitized RF echo signal in accordance with a predetermined compression parameter, and generating a first transmission signal in order to wirelessly transmit the compressed echo signal and sending the first transmission signal to a first radio channel, the control/imaging unit comprising:

a first receiver which receives the first transmission signal transmitted via the first radio channel and extracts the compressed echo signal from the received first transmission signal;

an echo expander which expands the compressed echo signal extracted by the first receiver in accordance with the compression parameter in order to obtain the RF echo signal; and an image reconstructor which generates a video signal regarding the subject on the basis of the RF echo signal obtained by the echo expander.

14. The magnetic resonance imaging apparatus according to claim 13, further comprising:

a parameter determining unit which determines at least one of parameters regarding the RF echo signal as the compression parameter, wherein the echo expander performs expansion in accordance with the compression parameter determined by the parameter determining unit.

* * * * *